United States Patent
Shilimkar et al.

(10) Patent No.: US 11,522,506 B2
(45) Date of Patent: Dec. 6, 2022

(54) COMPACT RFIC WITH STACKED INDUCTOR AND CAPACITOR

(71) Applicant: NXP B.V., Eindhoven (NL)

(72) Inventors: Vikas Shilimkar, Chandler, AZ (US); Kevin Kim, Gilbert, AZ (US); Joseph Gerard Schultz, Wheaton, IL (US)

(73) Assignee: NXP B.V., Austin, TX (US)

( * ) Notice: Subject to any disclaimer, the term of this patent is extended or adjusted under 35 U.S.C. 154(b) by 434 days.

(21) Appl. No.: 16/778,547

(22) Filed: Jan. 31, 2020

(65) Prior Publication Data

US 2021/0242840 A1 Aug. 5, 2021

(51) Int. Cl.
*H03F 3/14* (2006.01)
*H03F 3/213* (2006.01)
*H01L 27/06* (2006.01)
*H01L 49/02* (2006.01)
*H03F 3/68* (2006.01)

(52) U.S. Cl.
CPC ......... *H03F 3/213* (2013.01); *H01L 27/0629* (2013.01); *H01L 28/10* (2013.01); *H01L 28/20* (2013.01); *H01L 28/40* (2013.01); *H03F 3/68* (2013.01); *H03F 2200/222* (2013.01); *H03F 2200/451* (2013.01)

(58) Field of Classification Search
CPC ...... H03F 3/213; H03F 3/68; H03F 2200/222; H03F 2200/451; H03F 1/0288; H03F 3/195; H03F 3/245; H03F 3/187; H03F 3/347; H01L 27/0629; H01L 28/10; H01L 28/20; H01L 28/40; H01L 2924/3011; H01L 23/66
USPC .............. 330/124 R, 295, 302, 307, 310
See application file for complete search history.

(56) References Cited

U.S. PATENT DOCUMENTS

| | | | |
|---|---|---|---|
| 6,590,473 B1 * | 7/2003 | Seo | H01L 27/08 333/175 |
| 8,228,123 B2 * | 7/2012 | Blednov | H03F 1/0288 330/307 |
| 8,354,882 B2 * | 1/2013 | Blednov | H03F 3/195 330/53 |
| 8,829,999 B2 * | 9/2014 | Fisher | H01L 29/402 330/307 |
| 8,836,078 B2 | 9/2014 | Cho | |
| 2015/0235933 A1 * | 8/2015 | Ladhani | H01L 21/4853 330/307 |
| 2018/0323765 A1 | 11/2018 | Armanious et al. | |

* cited by examiner

*Primary Examiner* — Khanh V Nguyen

(57) ABSTRACT

Various embodiments relate to an integrated circuit including a transistor device having input and output terminals, and an inductor-capacitor (LC) circuit coupled to one of the terminals of the transistor device. The LC circuit includes a capacitor having a top plate and a bottom plate, a inductor having a coil structure, and a connector configured to couple the inductor and an interior portion the top plate of the capacitor. The inductor at least partially overlaps the capacitor.

16 Claims, 14 Drawing Sheets

COMPACT RFIC WITH STACKED INDUCTOR AND CAPACITOR

Various embodiments disclosed herein relate generally to a compact radio frequency integrated circuit (RFIC) with an inductor and capacitor (LC).

BACKGROUND

RFICs are widely used in various applications including high power applications. These RFICs may be used in conjunction with power amplifiers that operate at high frequencies (e.g., 1-2 GHz), and often such power amplifiers include resonant LC circuits. LC circuits that have high resonance frequencies $f_0$ can take up a large area of the RFIC in order to achieve the desired resonance frequency $f_0$. The physically large L and C components tend to increase IC size, complicate signal routing, and require many vias extending through the semiconductor substrate of the IC (through-substrate vias). Whenever possible, it is beneficial to reduce the size of RFICs, and reducing the size of LC circuits would help reduce the size of RFICs, as a single RFIC may include many LC circuits.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i e, and/or), unless otherwise indicated (e.g., "or else" or "or in the alternative"). Also, the various embodiments described herein are not necessarily mutually exclusive, as some embodiments can be combined with one or more other embodiments to form new embodiments.

The embodiments include an RFIC using one or more stacked inductor-capacitor (LC) structures that may enable a significant miniaturization of the RFIC die. Further, in an embodiment of a stacked LC structure, an inductor (L) may be aligned over a capacitor (C) in such a way that the feed for the capacitor connects to an interior portion of the top plate of the capacitor (e.g., near the center of the top plate) allowing for a more uniform current distribution. The stacked LC structure may be realized in a current semiconductor process flow with relatively simple mask changes, while avoiding changes to the process flow. In conventional circuits, an LC circuit to provide a radio frequency (RF) "cold" point/node may occupy a large area due to the inductance and the capacitance needed to resonate at the center frequency of operation, $f_o$, of the design (e.g., 1-2 gigahertz (GHz) designs). The implementation of an embodiment of a stacked LC circuit may significantly reduce the area of the aforementioned LC circuits used in typical RFIC designs. Some candidate circuits for such an implementation include bias line low Q inductor-shunt capacitor networks, frequency selective integrated circuits (FSICs) used for bifurcation, etc.

Figure 1:
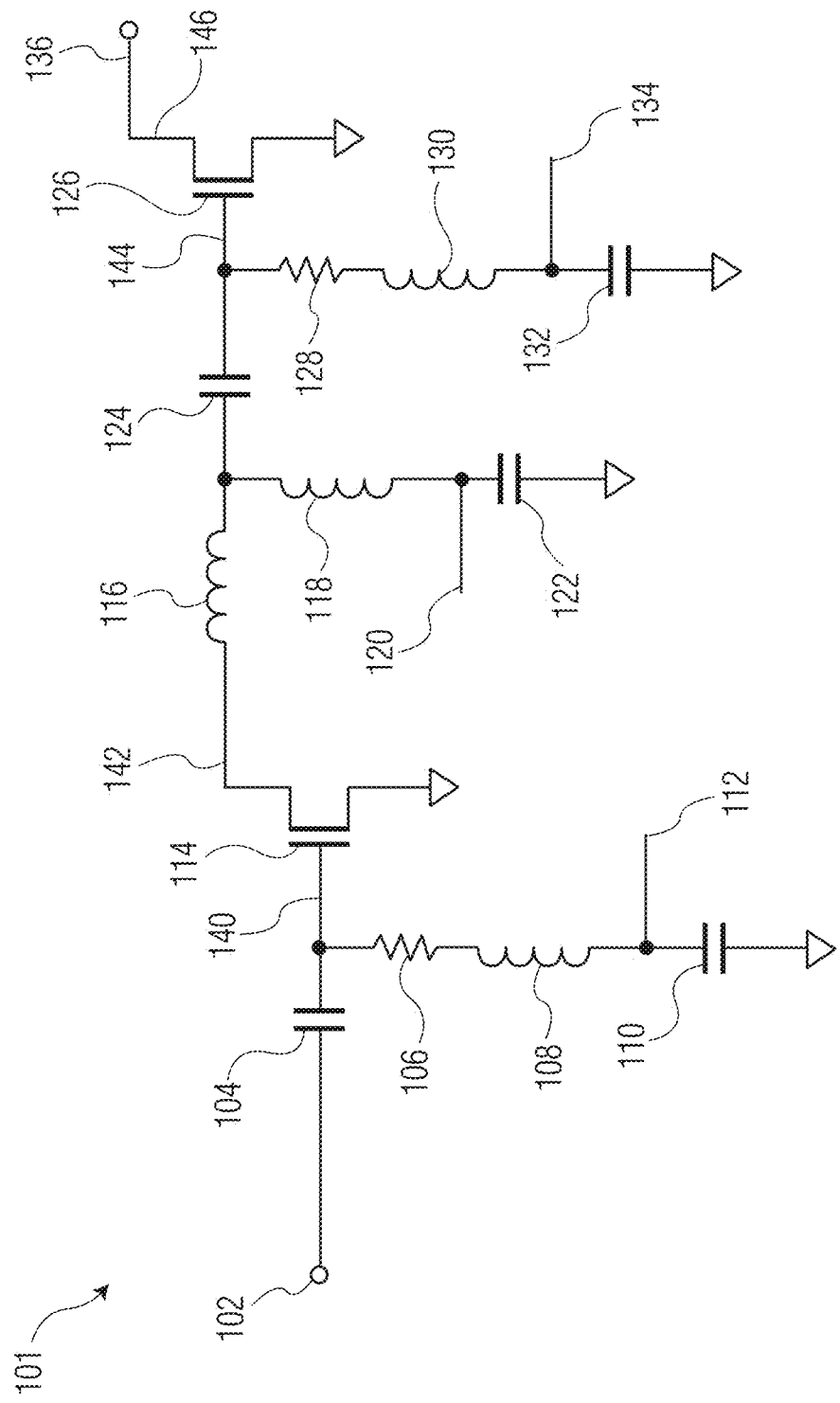
FIG. 1 illustrates a circuit diagram in schematic form of a two stage radio frequency integrated circuit (RFIC) power amplifier system.

Referring to FIG. 1, a circuit diagram is provided to show in schematic form a two stage radio frequency integrated circuit (RFIC) power amplifier system (or simply power amplifier) 101. In the present example embodiment, the power amplifier 101 includes a first amplification device 114 (e.g., a pre-amplifier power transistor) that may include a first field effect transistor (FET), and a second amplification device 126 (e.g., a final-stage amplifier power transistor) that may include a second FET. Each FET 114, 126 includes a gate terminal (or input terminal), a drain terminal (or output terminal), and a source terminal, which is electrically coupled to a ground node (e.g., on the bottom of the RFIC). Although each of the first and second amplification devices 114 and 126 are FETs in the present embodiment, in other embodiments encompassed herein other amplification devices may be employed including, for example, other types of transistor devices such as bipolar junction transistors (BJTs). Thus, although the FET terms "gate," "drain," and "source" are used herein, the use of such terms is not meant to limit embodiments only to those that utilize FETs for amplification devices 114, 126.

Further as shown, the signal that is to be amplified by the power amplifier 101 is a radio frequency (RF) input signal that is supplied to the power amplifier at a RF input port 102. Upon the RF input signal being received at the RF input port 102, that signal is provided to an input impedance matching and bias circuit that is coupled between the input port 102 and a first input terminal 140 (gate terminal) of the first amplification device 114. The input impedance matching and bias circuit modifies the RF input signal to generate a modified RF input signal that is communicated from the input matching and bias circuitry to the first input terminal 140. The input impedance matching circuit may include an input capacitor 104 connected between the RF input port 102 and the and first input terminal 140. The input impedance matching circuit may further include a series RLC (resistor-inductor-capacitor) circuit including resistor 106, inductor 108, and capacitor 110, wherein the RLC circuit is connected between the first input terminal 140 and ground. A bias voltage $V_{g1}$ 112 may be applied to a node between the inductor 108 and the capacitor 110 to bias the input to the first amplification device 114. In addition, the first amplification device 114 also includes a first output terminal 142 (e.g., drain terminal). By virtue of operation of the first amplification device 114, the modified (impedance transformed) RF input signal received at the first input terminal 140 is amplified to generate a first amplified output signal that is output at the first output terminal 142.

Additionally as shown, the first output terminal 142 of the first amplification device 114 is coupled to an interstage impedance matching and bias circuit, which is coupled between that first output terminal 142 and a second input terminal 144 (gate terminal) of the second amplification device 126. By virtue of this arrangement, the interstage impedance matching and bias circuit modifies the first amplified output signal provided by the first amplification device 114 at the first output terminal 142 to generate an additional RF input signal that is communicated to the second input terminal 144. The interstage impedance matching and bias circuit includes an inductor 116 and a capacitor 124 that are connected in series between the first output terminal 142 and the second input terminal 144, with the inductor 116 connected between first output 142 and capacitor 124. The interstage impedance matching circuit further includes an LC circuit with an inductor 118 connected to a node between inductor 116 and capacitor 124, and a capacitor 122 connected between the inductor 118 and ground. A bias signal $V_{dt}$ 120 may be applied to a node between the inductor 116 and the capacitor 122 to bias the output of the first amplification device 114. Also, the interstage impedance matching and bias circuit further includes an RLC circuit with a resistor 128 connected to the second input 144 and an inductor 130, wherein the inductor 130 is further connected to a capacitor 132, which is further connect to ground. A bias signal $V_{g2}$ 134 may be applied to a node between the inductor 130 and the capacitor 132 to bias the input to the second amplification device 126. Upon the second amplification device 126 receiving the additional RF input signal, that amplification device further amplifies that signal and generates a second amplified output signal (i.e., an RF output signal), which is output at a second output terminal 146 (drain terminal) of the second amplification device 126. As illustrated, the second output terminal 146 is directly coupled to (or itself forms) a RF output port 136 of the power amplifier 101, and the RF output signal generated by the second amplification device 126 accordingly can be output from the power amplifier 101 at that output port.

Figure 2:
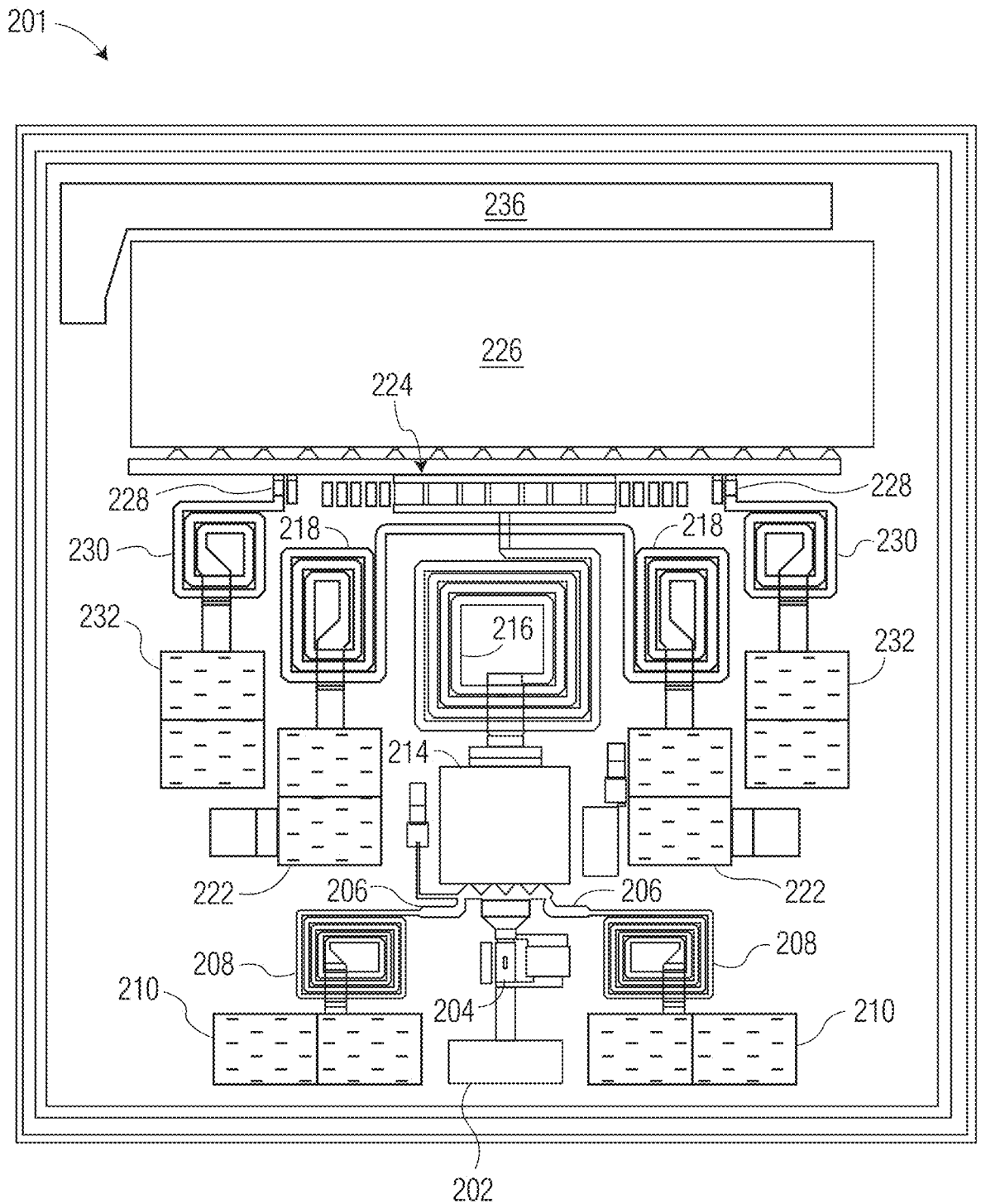
FIG. 2 illustrates a layout diagram of a top view of the power amplifier of FIG. 1 implemented on a monolithic semiconductor die.

Turning to FIG. 2, a layout diagram is provided that shows a top view of the power amplifier 101 of FIG. 1 implemented on a monolithic semiconductor die in more detail to reveal additional components (or subcomponents) of the power amplifier as shown in FIG. 1. The semiconductor die includes a base semiconductor substrate (e.g., silicon, gallium nitride, gallium arsenide, and so on) in which various doped regions are formed (e.g., drain and source regions), and a build-up structure over the base semiconductor substrate that includes a plurality of patterned conductive layers that are separated by a plurality of dielectric layers, where portions of the patterned conductive layers are electrically coupled using conductive vias. For example, the build-up structure may include patterned conductive layers designated as M1, M2, M3, M4, M5, and so on, where the lower numbered metal layers are physically closer to the base semiconductor substrate. In FIG. 2 each of the circuit elements from FIG. 1. are shown using a similar numbering scheme. That is circuit elements 104, 106, 108, 110, 114, and 126 correspond to circuit elements 204, 206, 208, 210, 214, and 226 in FIG. 2. The same correspondence is present for the other circuit elements of FIG. 1. As illustrated in the layout diagram 200, the power amplifier 201 includes each of the first amplification device (FET) 214, the second amplification device (FET) 226, the input matching circuitry 204, 206, 208, 210, and the interstage matching circuitry 216, 218, 222, 224, 228, 230, 232 coupled in series with one another between the RF input port 202 and the RF output port 236, in a manner corresponding to what is shown in FIG. 1. RF input port 202 may be considered a conductive bonding pad (or simply "pad", herein), and RF output port 236 may be considered a pad as well. The various pads may be exposed at the top surface of the die, and configured for attachment of wirebonds to provide electrical connections to exterior circuitry.

Some or all of the inductors 208, 216, 218, 230 may be implemented as distributed "spiral" inductors formed from patterned portions of one or more conductive layers of the build-up structure over the base semiconductor substrate, where each inductor includes first and second ends (or terminals) and a conductive spiral structure between the first and second ends. Each of the inductors 208, 216, 218, 230 may have an inductance value in a range of about 0.5 nanohenries (nH) to about 10 nH in an embodiment (e.g., in an embodiment in which the RFIC has a center frequency of operation of about 1 to 3.5 GHz), although the inductance values may be smaller or larger depending on frequency and power level, as well.

In addition, some or all of the capacitors 204, 210, 222, 224, 232 may be implemented as parallel plate capacitors with first and second plates formed from overlapping, substantially rectangular patterned portions of two or more conductive layers of the build-up structure over the base semiconductor substrate. For example, a lower plate may be formed from one metal layer (e.g., M4), and an upper metal plate may be formed from another metal layer (e.g., M5), with dielectric material between the two plates. The first plate of each capacitor may be electrically connected (e.g., to inductors 208, 216, 218, 230) as described below, and the second plate of each capacitor may be electrically connected to a ground reference (e.g., at the bottom surface of power amplifier 201) with through-substrate vias. For example, each of capacitors 204, 210, 222, 224, 232 may also be implemented as a metal-insulator-metal (MIM) capacitor, a metal oxide semiconductor (MOS) capacitor (or "MOS CAP"), or another type of capacitor. The capacitors 204, 210, 222, 224, 232 may have capacitance values in a range of about 5 picofarads (pF) to about 35 pF, in an embodiment, although the capacitance values may be smaller or larger, as well.

The input matching and bias circuit includes capacitor 204 connected between the RF input 202 and the gate of the first amplification device 214. Further, the input matching and bias circuit includes the series RLC circuit including resistors 206, inductors 208, and capacitors 210 connected in series between the gate of the first amplification device 214 and the ground reference. Note, in the power amplifier IC 201, that two instances of the RLC circuit are shown and connected in parallel. One instance is present on either side of the input to the first amplification device 214, which is a conventional design used to implement such circuits as shown in FIG. 1. It is noted that certain other elements in the power amplifier 214 are implemented in this same parallel manner.

The interstate impedance matching and bias circuit is coupled between the output of the first amplification device 214 and the gate of the second amplification device 226. The interstage impedance matching and bias circuit includes an inductor 216 and a capacitor 224 that are connected in series between the output of the first amplification device 214 and the input terminal of the second amplification device 226, with the inductor 216 connected between the output of the first amplification device 214 and a node coupled to a first plate of capacitor 224, and a second plate of capacitor 224 is connected to the input terminal of the second amplification device 226. The interstage impedance matching and bias circuit further includes an LC circuit with an inductor 218 connected to the node between inductor 216 and capacitor 224, and a capacitor 222 connected between the inductor 218 and ground. Also, the interstage impedance matching and circuit further includes an RLC circuit with a resistor 228 connected to the input of the second amplification device 226 and an inductor 230, wherein the inductor 230 is further connected to a capacitor 232, which is further connect to ground. It can be noted that, across the horizontal plane of the build-up structure, the inductors 208, 218, 230 of the LC circuits are implemented in different areas of the build-up structure from the areas in which the capacitors 210, 222, 232 of the LC circuits are implemented. In other words, the inductors 208, 218, 230 and the capacitors 210, 222, 232 do not overlap each other, but instead are disposed in horizontally adjacent areas of the build-up structure. The LC and RLC circuits of the interstage impedance matching and bias circuit each have two parallel instances of the circuit as described above with respect to the RLC circuit of the input impedance matching and bias circuit.

Finally, the output of the second amplification device 226 is connected to the RF output 236. As described above, the RF output 236 may be a conductive bonding pad that is configured for the attachment of wirebonds to provide electrical connections to exterior circuitry.

Figure 3:
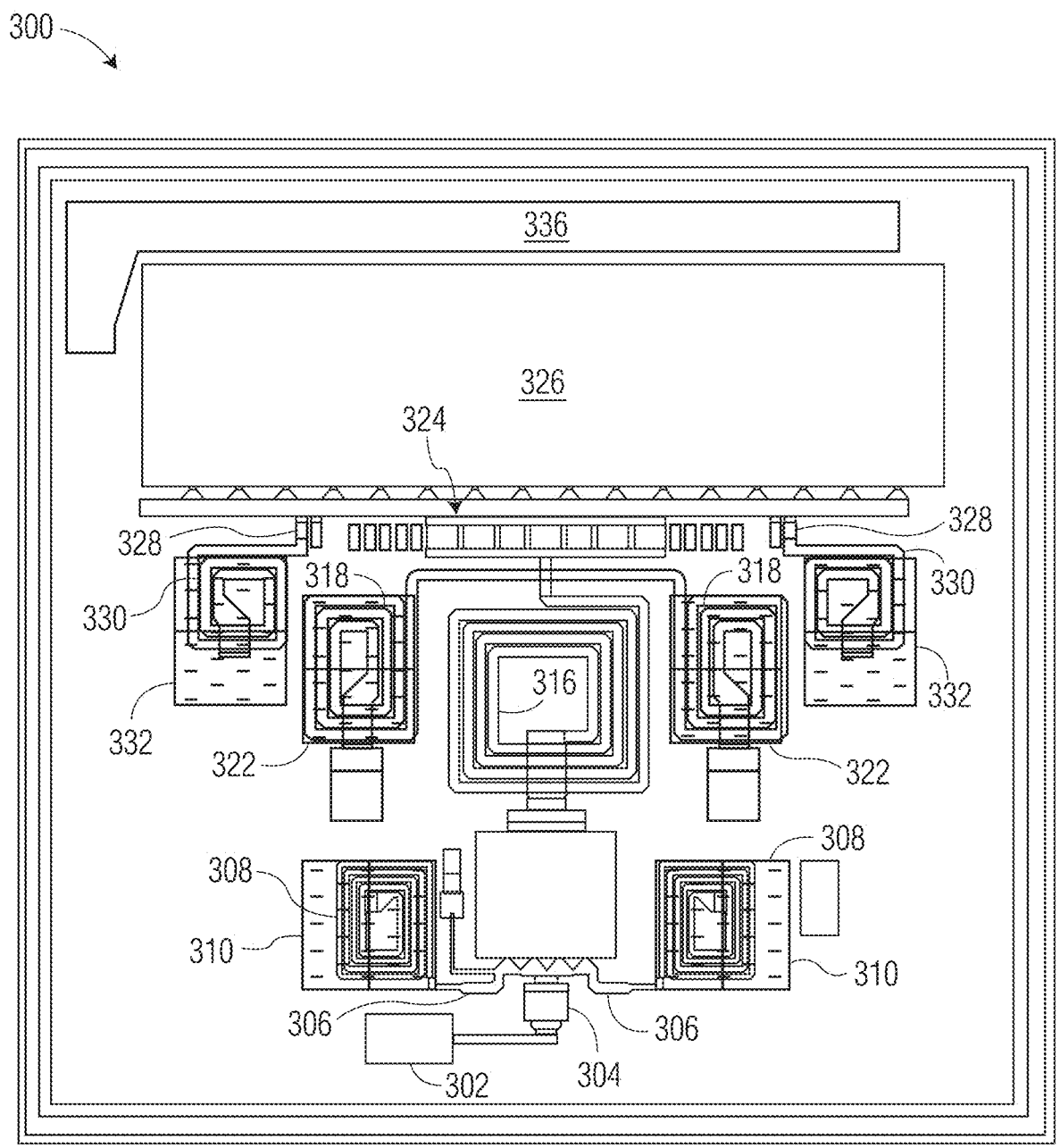
FIG. 3 illustrates a layout diagram of an embodiment of the power amplifier of FIG. 1 that uses embodiments of stacked LC circuits in order to reduce the size of the power amplifier.

FIG. 3 is another layout diagram of an embodiment of the power amplifier 101 of FIG. 1 that uses stacked LC circuits in order to reduce the size of the power amplifier 301. As shown in FIG. 3, in each LC circuit, a series-connected capacitor and inductor are now configured in a stacked or overlapping arrangement, in the horizontal plane of the build-up structure (i.e., each LC circuit incudes a stacked LC). In other words, the inductors 308, 318, 330 and the capacitors 310, 322, 332 overlap each other, and LC pair is disposed in a single area of the build-up structure. For example the inductors 308, 318, and 330 are stacked respectively with capacitors 310, 322, and 332. Otherwise, the power amplifier 301 largely is laid out like the power amplifier 201 of FIG. 2 where the elements have a similar numbering scheme as FIG. 1 (and FIG. 2). The stacked LC will now be further described.

Figure 4:
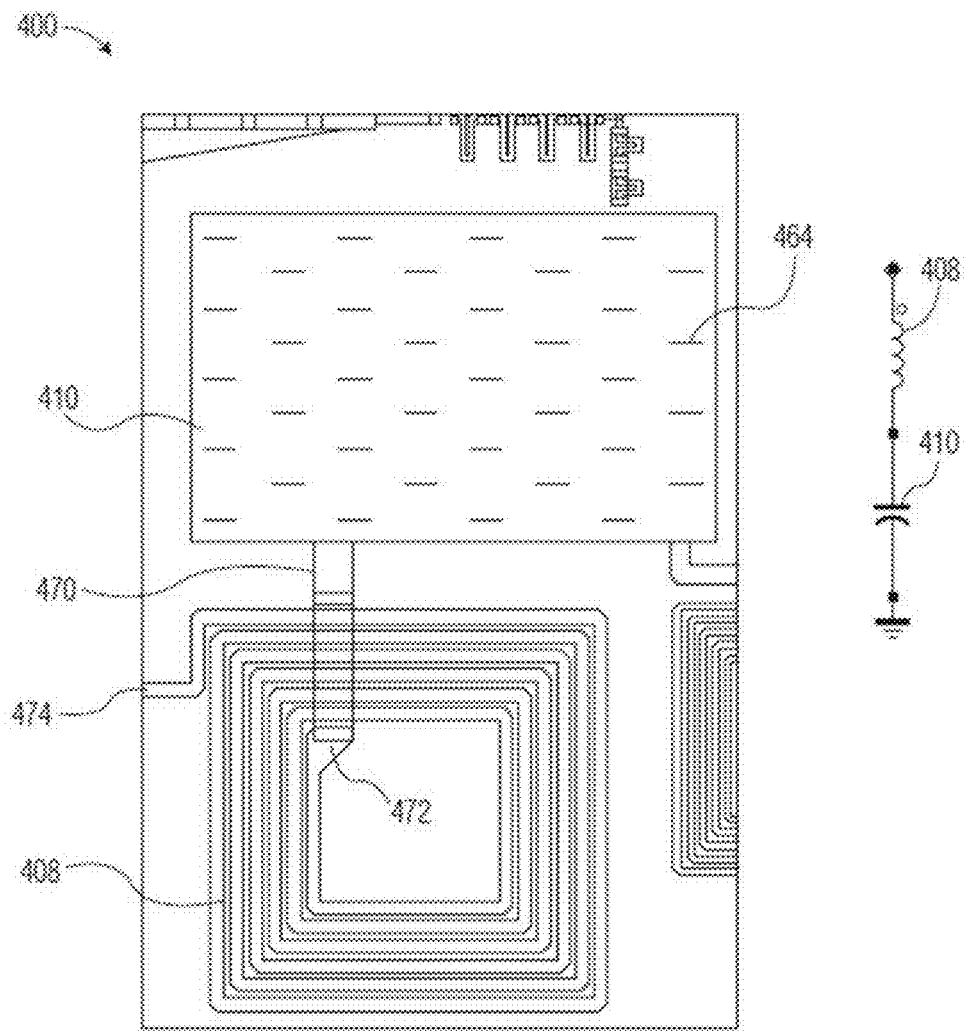
FIG. 4 illustrates an example layout of a conventional LC circuit like those found in FIG. 2.

FIG. 4 illustrates an example layout of an LC circuit like those found in FIG. 2. Also an equivalent circuit diagram is shown. The LC circuit includes capacitor 410 and inductor 408. The capacitor 410 may be a MIM type or MOS type capacitor as described above. The capacitor 410 includes an upper plate and lower plate with a dielectric material in between. The lower plate may be connected to ground using through substrate vias (TSV) 464. The TSVs 464 are shown in a bar shape, but may be any other shape as well. The TSVs extend through a base semiconductor substrate (not shown here) to a conductive layer on the backside of the base semiconductor substrate. The top plate of the capacitor 410 is connected to a first terminal of the inductor 408 using a connector 470. The connector 470 is an underpass connector in this example. That is, the connector 470 is formed in a metal layer below (e.g., closer to the base semiconductor substrate) the metal layer(s) that form the inductor 408. The connector 470 is then connected to the first terminal 472 of the inductor 408 that is in the center of the inductor 408 using one or more vias between the different conductive layers. The connector 470 may also use a via to connect to the top plate of the capacitor 410, if the connector 470 and the top plate are on different levels of the IC. As illustrated, the inductor 408 is a coil conductor as described above. A second terminal 474 of the inductor 408 is electrically coupled to other components of the RFIC, as described above.

Figure 5:
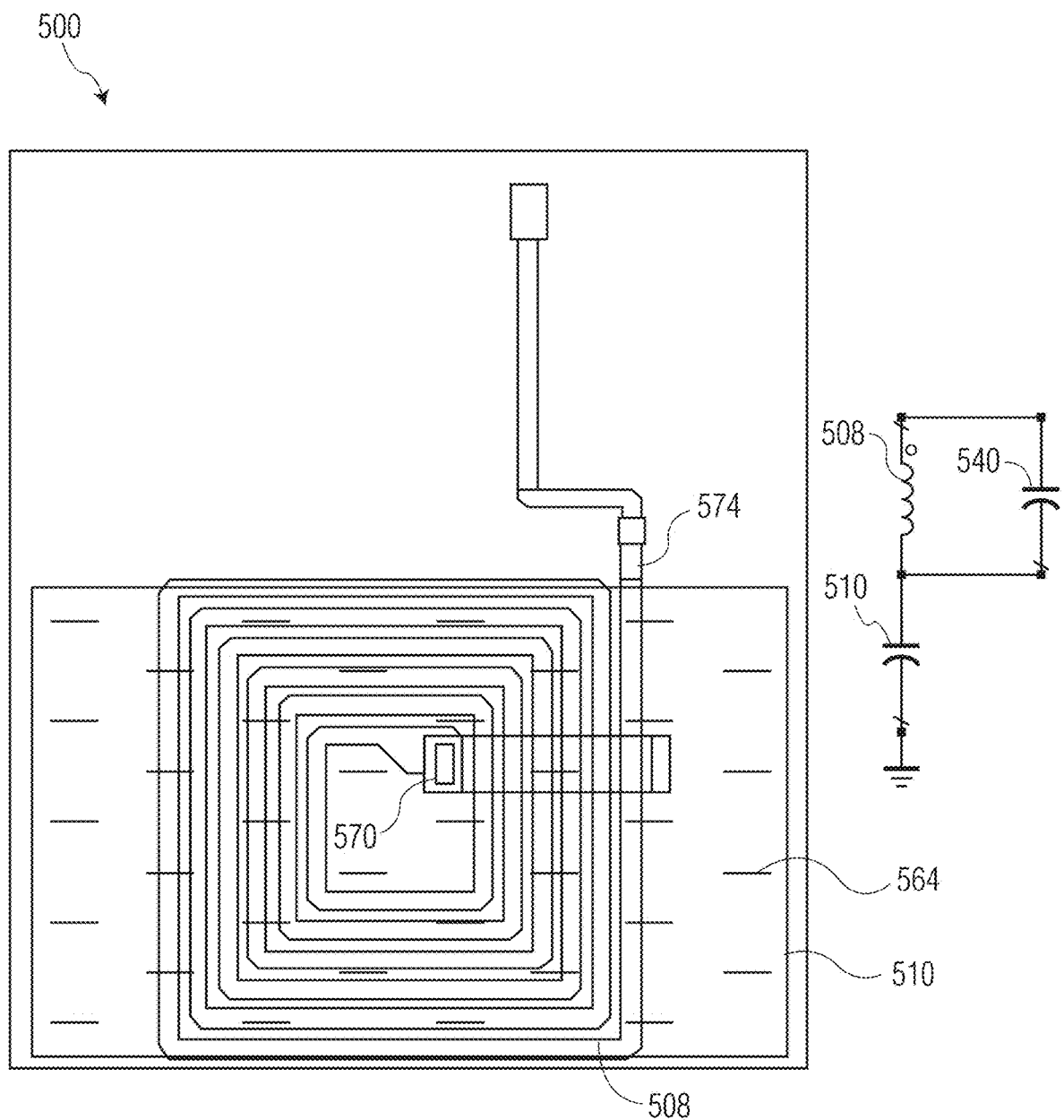
FIG. 5 illustrates an example layout of an embodiment of a stacked LC circuit like those found in FIG. 3.
Figure 6:
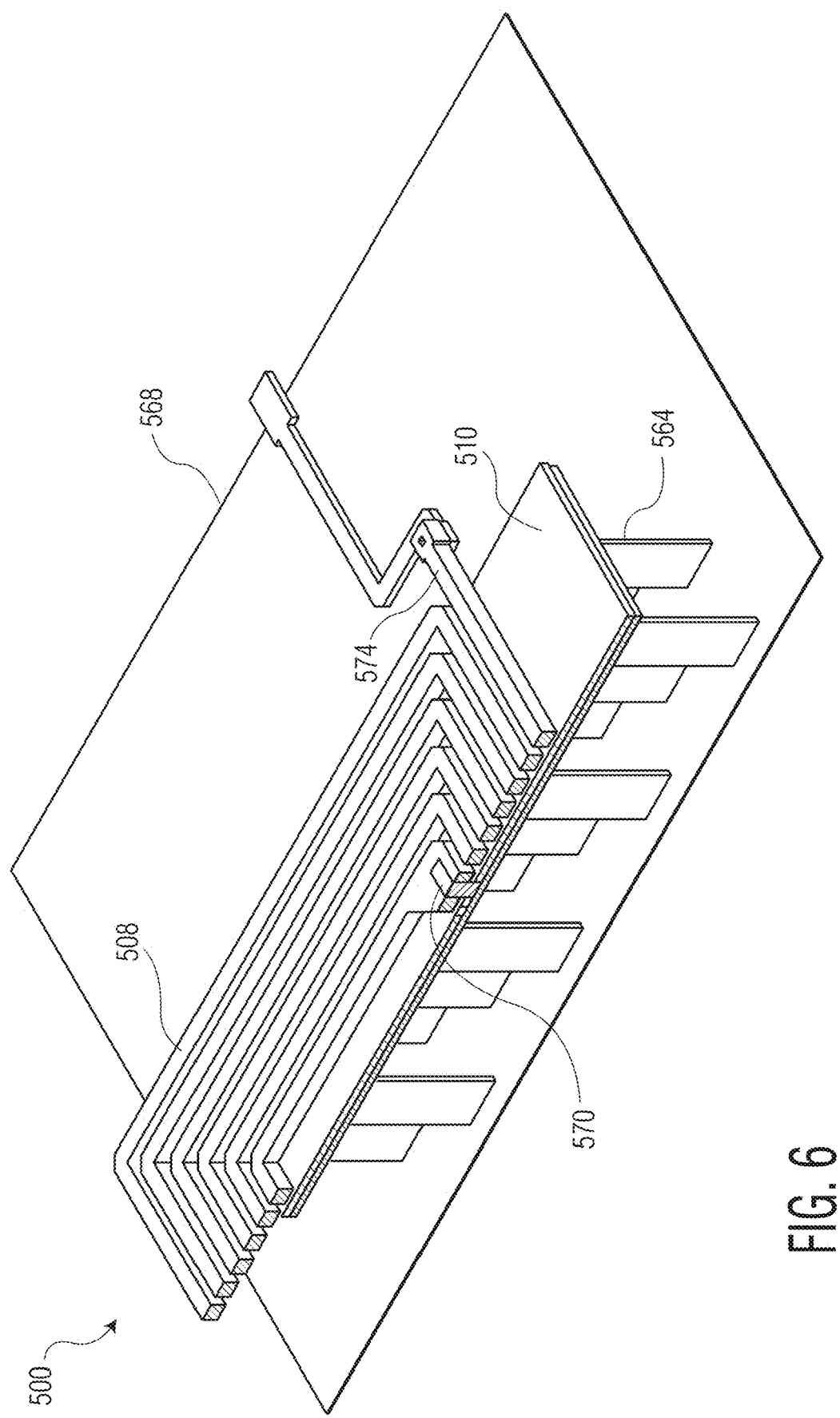
FIG. 6 illustrates a cross sectional perspective view of a stacked LC circuit.
Figure 7:
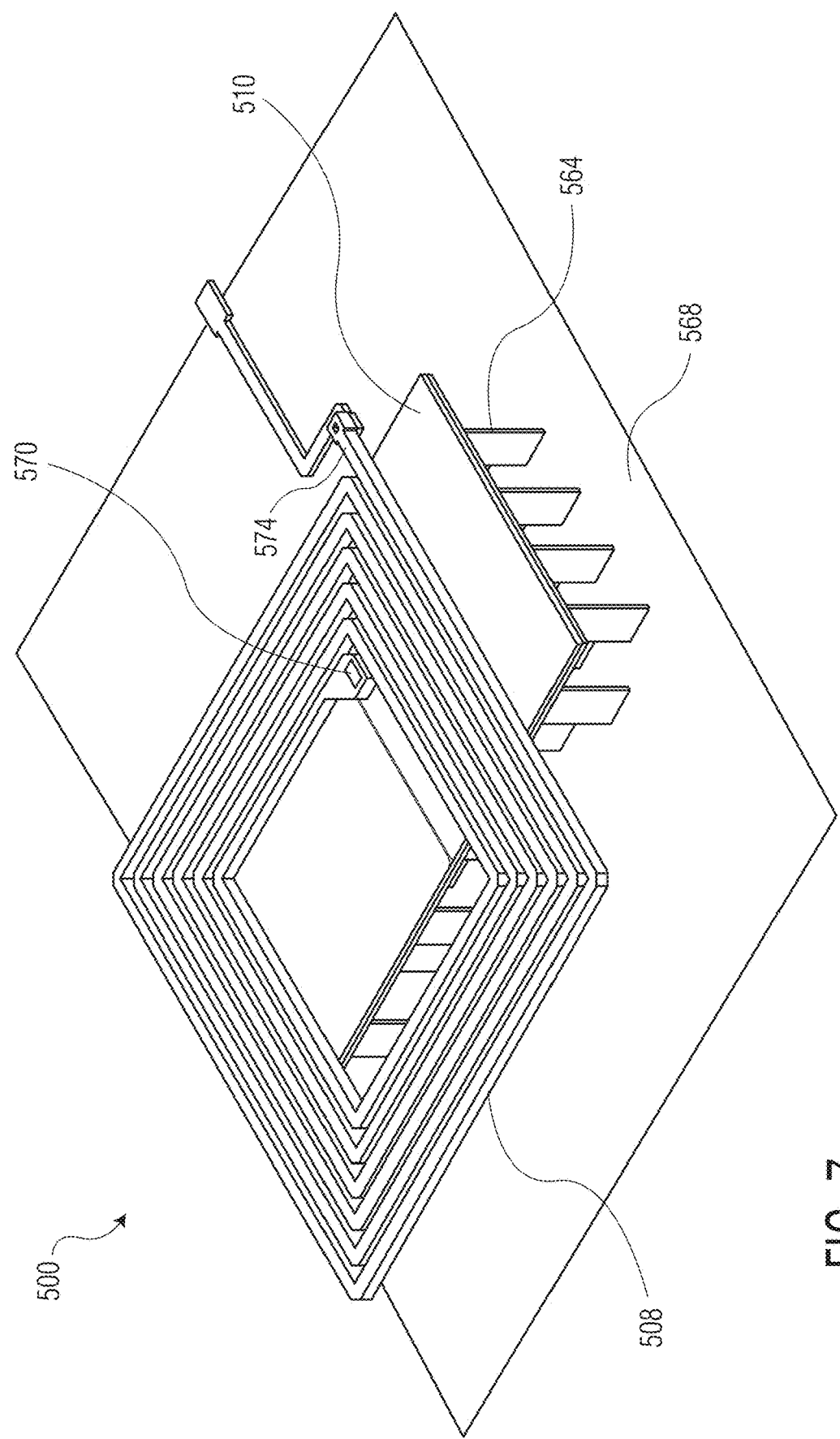
FIG. 7 illustrates another perspective view of a stacked LC circuit.
Figure 8:
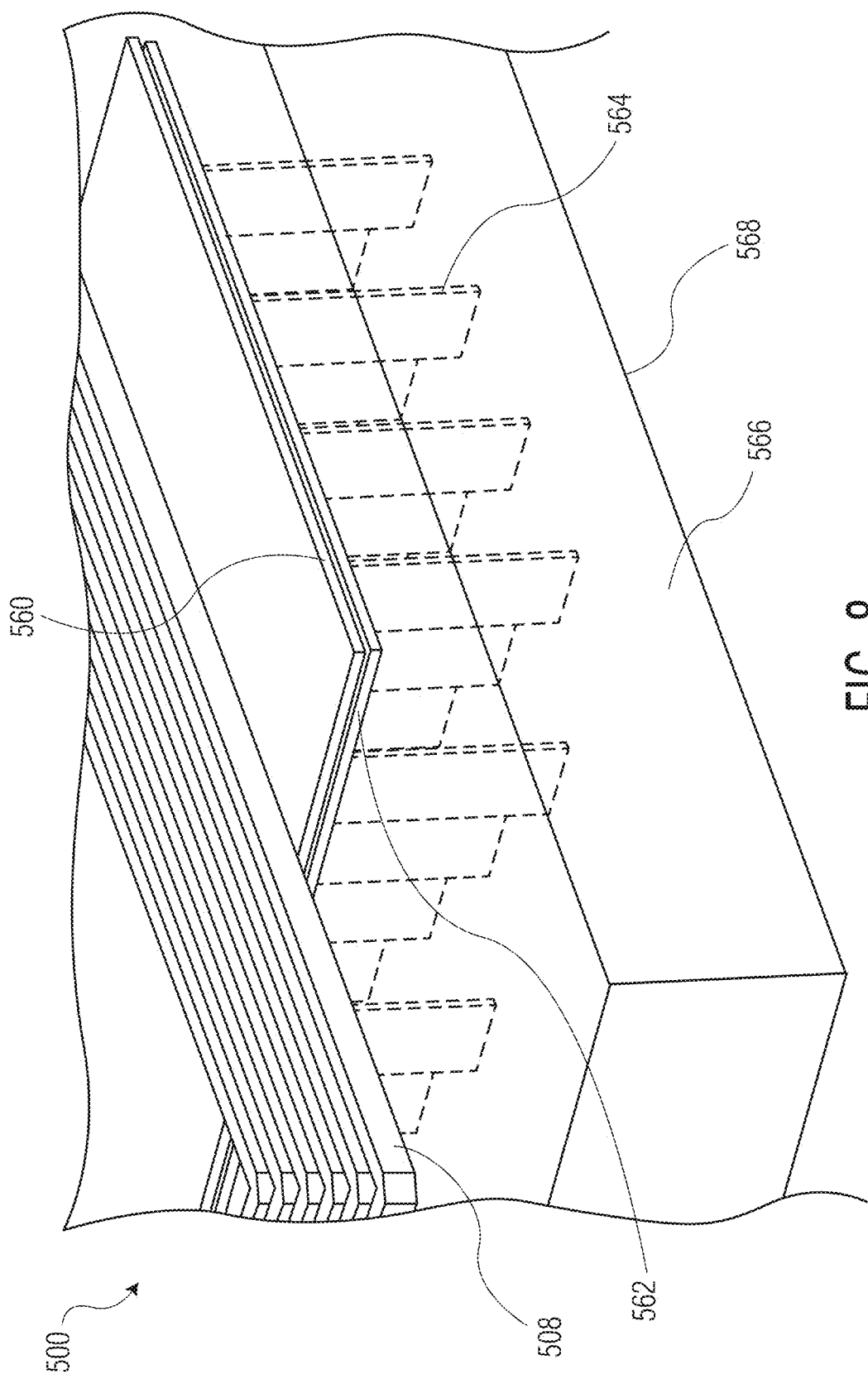
FIG. 8 illustrates a closeup view of the stacked LC circuit of FIG. 7.

FIG. 5 illustrates an example layout of a stacked LC circuit like those found in FIG. 3. Also an equivalent circuit diagram is shown. FIG. 6 illustrates a cross sectional perspective view of the stacked LC circuit, FIG. 7 shows a perspective view of the stacked LC circuit, and FIG. 8 shows a closeup view of the stacked LC circuit. Stacked LC circuit 500 includes capacitor 510 and inductor 508. The capacitor 510 may be a MIM type or MOS type capacitor as described above. Referring to FIG. 8, the capacitor 510 includes an upper plate 560 and lower plate 562 with a dielectric material in between. The lower plate 562 may be connected to ground using through substrate vias (TSV) 564. The TSVs 564 are shown in a bar shape, but may be any other shape as well. The TSVs extend through a base semiconductor substrate 566 to a conductive layer 568 on the backside of the substrate 566. The top plate 560 of the capacitor 510 is connected to a first terminal of the inductor 508 using a connector 570. As illustrated, the inductor 508 has a coil structure, and the first terminal is present at the central region of the coil structure and a second terminal 574 at the outer edge of the coil structure.

Figure 9:
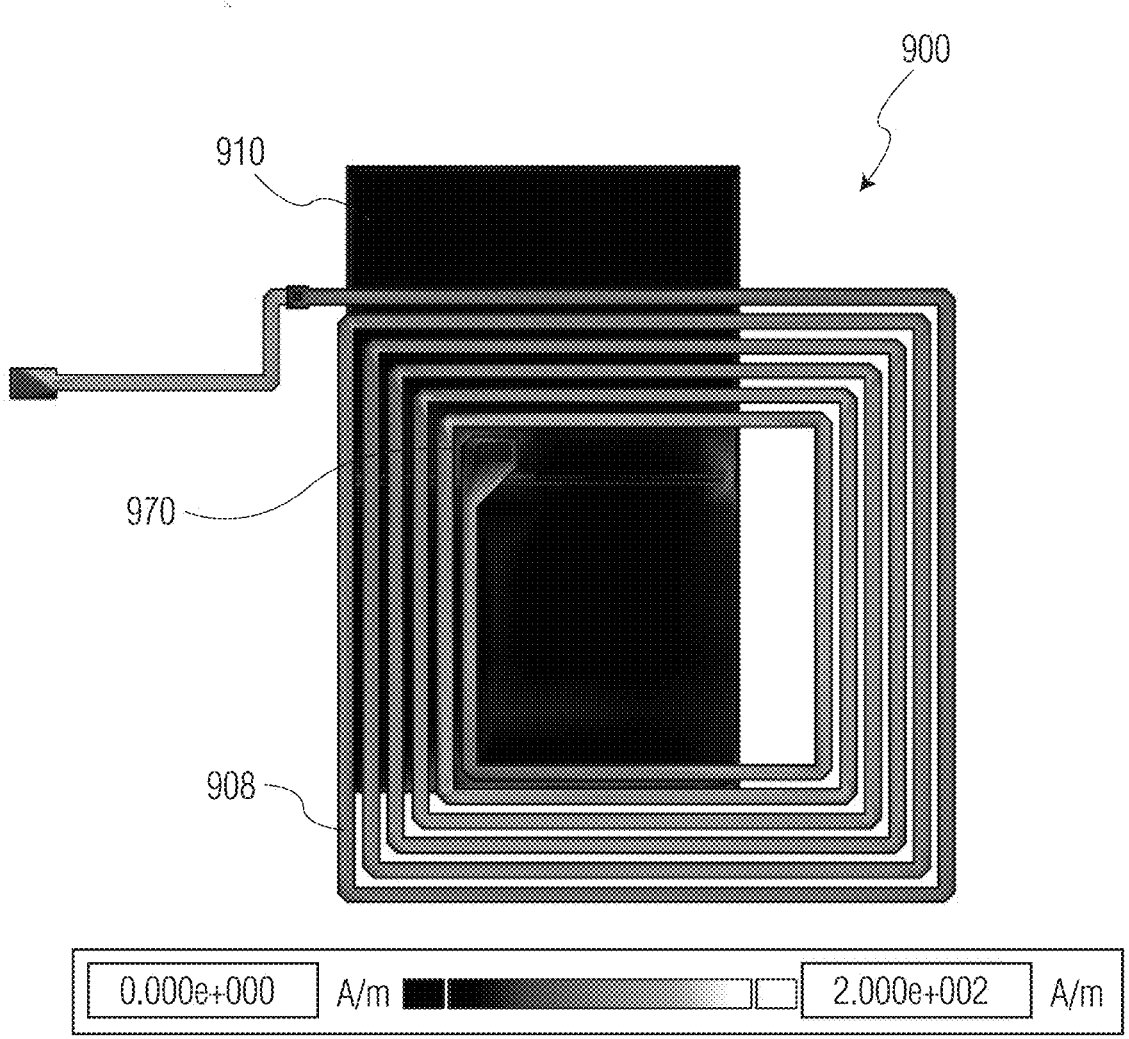
FIG. 9 illustrates a top view of the current density of a stacked LC circuit.
Figure 10:
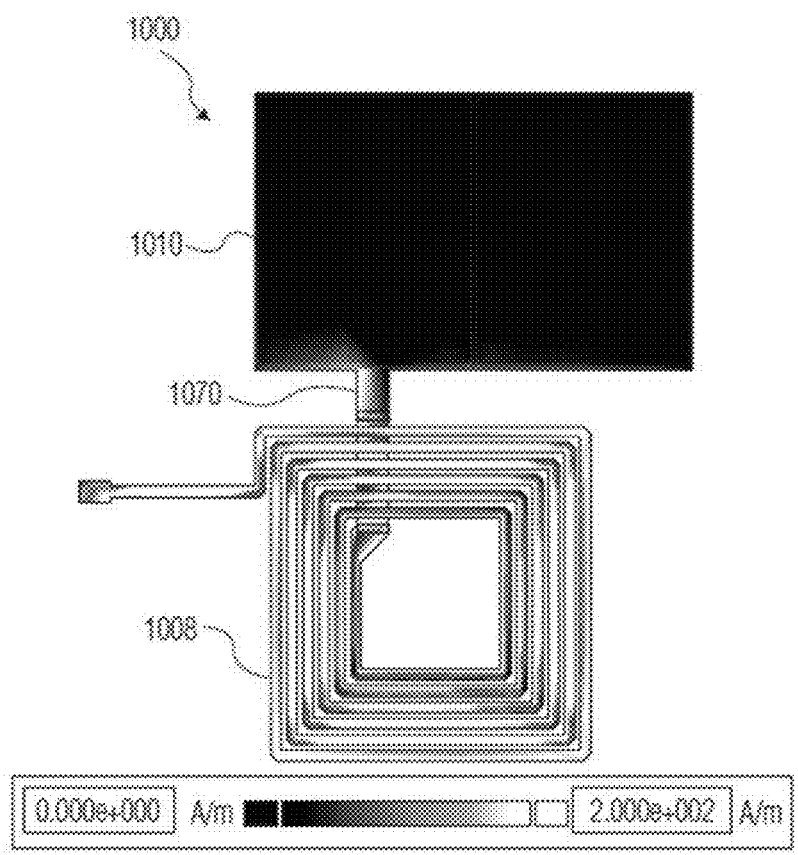
FIG. 10 illustrates a top view of the current density of a conventional LC circuit.
Figure 11:
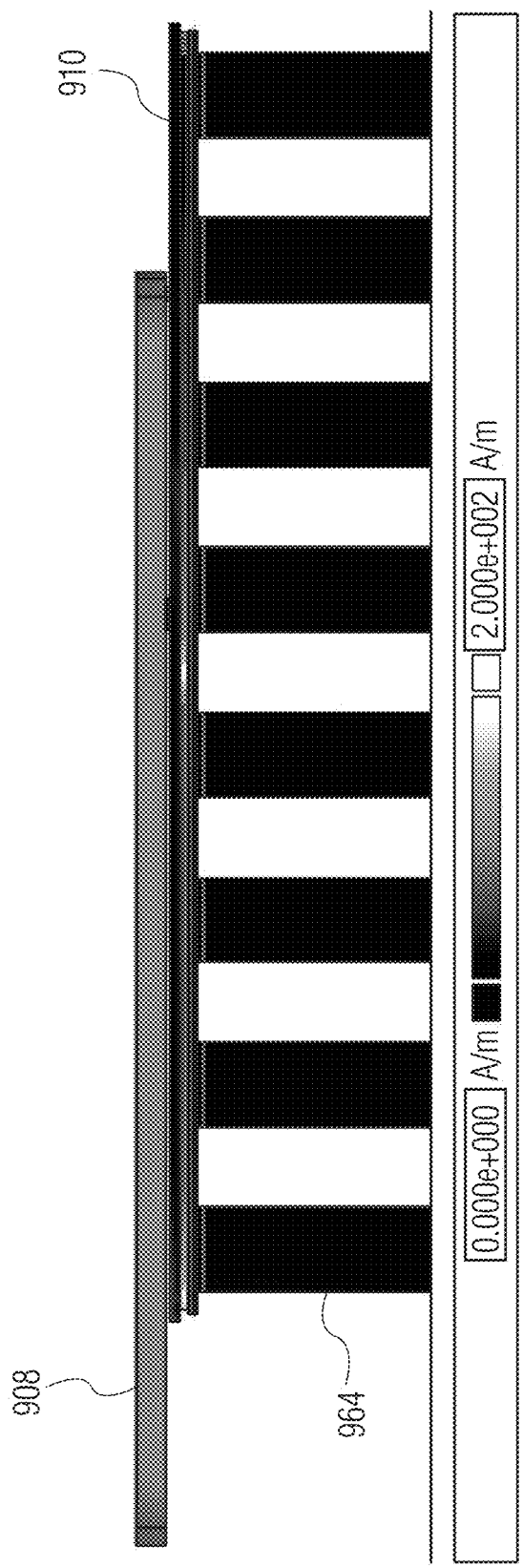
FIG. 11 illustrates a side cross sectional view of the current density of the stacked LC circuit of FIG. 9.
Figure 12:
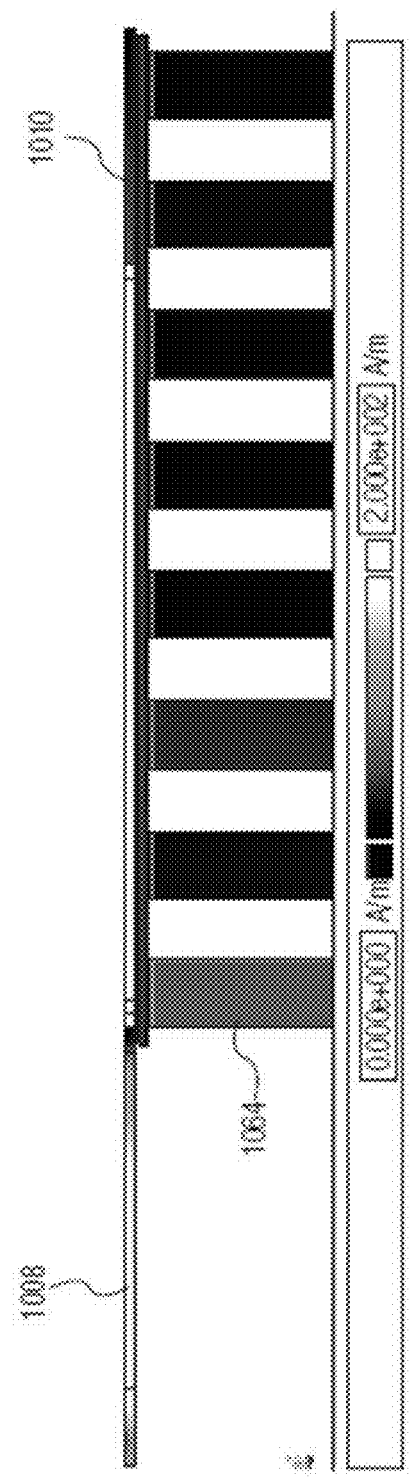
FIG. 12 illustrates a side cross sectional view of the current density of the conventional LC circuit of FIG. 10.

In the LC circuit of FIGS. 2 and 4 the connector 470 is physically coupled to an edge of the top plate of the capacitor 410. As used herein, this is referred to as being "edge fed." In contrast, in the LC circuit of FIGS. 3, 5, and 6, the connector 570 is physically coupled to an interior portion of the top plate 560 of the capacitor 510 (i.e., a portion at least 10 percent of the width of the top plate 560 away from the edge). As used herein, this is referred to as being "center fed." One issue that arises with the LC circuit of FIGS. 2 and 4 is that, during operation, the current in the capacitor 410 is concentrated along the edge of the capacitor 410 near where the connector 470 connects to the capacitor 410. An electromagnetic (EM) simulation of a conventional unstacked LC circuit and an embodiment of a stacked LC circuit was performed to determine the current density in the LC circuit. In the simulation, port excitation at the inductor input for both the unstacked LC circuit and the stacked LC was the same. The stacked LC circuit was optimized to achieve impedance close to the unstacked LC circuit. FIG. 9 illustrates a top view of the current density of the stacked LC circuit 900, and FIG. 11 illustrates a side cross sectional view of the current density of the stacked LC circuit 900. FIG. 10 illustrates a top view of the current density of the conventional unstacked LC circuit 1000, and FIG. 12 illustrates a side cross sectional view of the current density of the conventional unstacked LC circuit 1000. The current density plots illustrate that the distribution of current in the capacitor (e.g., capacitor 510) of the center fed stacked LC circuit 900 is more uniform than the distribution of current in the capacitor (e.g., capacitor 410) of the edge fed unstacked LC circuit 1000. As can be seen in FIG. 10, the current density along the edge of the capacitor 1010 where the connector 1070 connects to the capacitor 1010 is much higher than elsewhere. This then leads to increased current density in the TSVs 1064 closer to the edge of the capacitor 1010 that is connected to the connector 1070 as shown in FIG. 12. FIG. 9 illustrates that the current density of the capacitor 910 is much more uniform with only a few areas where the density increases, and the increased density is lower than the current density peaks in FIG. 10. It is also noted the current density in the inductor 908 of the stacked LC circuit 900 is much more uniform than the current density of the inductor 1008 of the unstacked LC circuit. This may be due to at least two factors. First, in an embodiment, the inductor 908 may be made from a relatively thick copper layer (e.g., about 8-12 microns thick, such as 10 microns thick), while the inductor 1008 is made from a relatively thin aluminum layer (e.g., about 3.6 microns thick). Thus, the thicker metal layer for inductor 908 decreases the current density. Second, the difference in material properties of copper versus aluminum also affect the differences in current density.

The lower current densities of the stacked LC circuit 900, results in various benefits. For example, it is known that TSVs may be a source of failures in integrated circuits. Increased current densities can lead to increased TSV failures. Alternatively, the TSVs need to be designed with increased current handling capacity which increases the amount of material needed as well as cost or more TSVs are needed. Likewise, the plates of the capacitors are designed to accommodate the maximum current density found in the capacitor. Because of the increased current density in the capacitor 1010, the plates should be designed to accommodate the local current density peaks, which also increases the plate thickness (and thus the amount of material used) as well as the cost. Also, increased current density can lead to break down of the capacitor, thus reducing the reliability of the capacitor or promoting overdesign of the capacitor to handle the current density peaks. Thus, the increased uniformity of the current density observed in the stacked LC circuit 900 during operation means that the metal layers may be designed for a reduced maximum current capability.

The stacked LC circuit may be utilized in matching network sections that include a resistor placed in series with the LC combination to improve amplifier stability. It should be noted that the proximity of the inductor coil to the top plate of the capacitor may results in a non-negligible parasitic capacitance 540 (as shown in the equivalent circuit diagram of FIG. 5). This parasitic capacitance 540 may be accounted for in the overall design of the stacked LC circuit to compensate for the effects of this parasitic capacitance 540. For example, this parasitic capacitance my warrant the use of a coil with reduced inductance, when compared with the inductance of a coil in an unstacked LC circuit, (e.g., a 10 nH inductor in an unstacked LC circuit may become an 8 nH inductor in a stacked LC circuit).

Regarding power amplifier performance, the stacked LC circuit may have increased overall resistance. In some situations, the resistors (for example 306, 328 in FIG. 3) may be reduced to manage gain and stability. In some embodiments, the resistors may be completely replaced by the resistance in the stacked LC circuit. This may be done to obtain the same frequency response as when using a conventional RLC circuit. Also, a designer may trade-off gain to reduce the RFIC die area. For example, 1 GHz RFIC designs may have ample gain to trade-off to reduce the layout area to meet smaller die area requirements.

In many implementations of RFICs, the various metal layers may be made of aluminum as is typical in CMOS processing. In the conventional LC circuit 400, the inductor 408 may be made of aluminum. In the stacked LC circuit 500, the inductor 508 may be made of aluminum or copper, because a copper process may be used after and on top of the CMOS processing used to form the capacitor 510. In other embodiments, various combinations of metals may be used for the various metal layers in any combination based upon the underlying manufacturing processes.

The stacked LC circuit uses a connector 570 between the inductor 508 and capacitor 510, that connects to the top plate of the capacitor 510 (see FIG. 5) instead of connecting at the edge of the capacitor 410 in the conventional LC circuit (see FIG. 4). This may improve the current density uniformity in the capacitor. It also may reduce the complexity of the connection 570 between the capacitor 510 and the inductor 508, which may be implemented using a simple conductive via. In the conventional LC circuit 400, this connector 470 includes a conductive trace that goes under the inductor 408, along with conductive vias, which increases the complexity of the conventional unstacked LC circuit in comparison with an embodiment of a stacked LC circuit.

The connector 570 connects to the capacitor 510 away from the capacitor edge (e.g., in a central region of the capacitor 510). This central region may be defined as an area centered about the center of the capacitor. This may be the central 20%, 30%, 40%, 50%, 60%, 70% or 80% of the capacitor.

The stacked LC circuit 500 may have a complete or partial overlap between the areas of the inductor 508 and the capacitor 510. The available overlap options depend upon the relative sizes of the inductor and the capacitor. For example, when the inductor area is smaller than the capacitor area, the inductor may be placed so that the complete area of the inductor overlaps the capacitor. In this case the precise location may be driven by placing the connector as near the center of the capacitor as possible or in a specified central location. In another embodiment, it may be desirable to have such an inductor only partially overlap the capacitor with the connector in a desired central area. This may be done to reduce the losses and parasitic capacitance or to achieve certain specific circuit characteristics at the expense of increased area. In the case where the inductor area is greater than the capacitor area, similar considerations may be used to determine the amount of overlap between the capacitor and inductor. In various embodiments, a percentage of the area of the inductor 508 that overlaps the capacitor 510 is at least 10%, at least 25%, at least 50%, at least 75%, or 100%.

Figure 13:
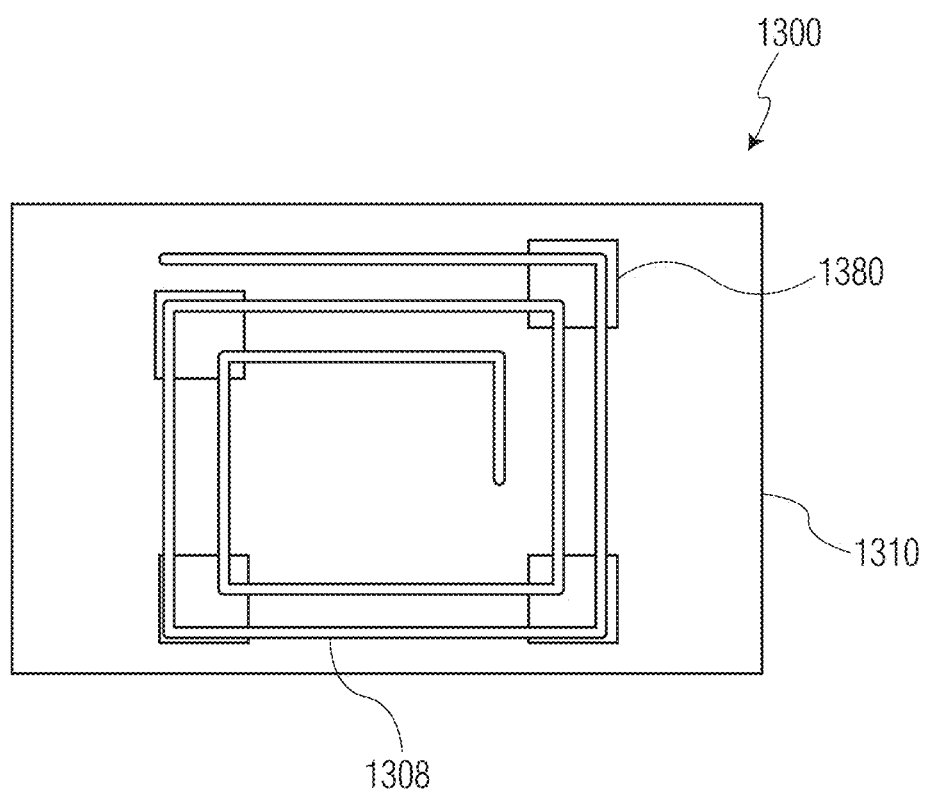
FIG. 13 illustrates an embodiment of a stacked LC circuit with a capacitor having holes.

FIG. 13 illustrates a stacked LC circuit 1300 with a capacitor 1310 having holes 1380 in either or both of the top and/or bottom conductive plates of the capacitor 1310. The holes 1380 are shown as being aligned with the corners of the inductor 1308. The corners of the inductor 1308 may cause fringe effects by interacting with the capacitor 1310, and accordingly holes 1380 in the capacitor 1310 that are aligned with corners of the inductor 1308 may reduce these fringe effects. Further, the holes 1380 may also minimize parasitic capacitance between the inductor coil and the capacitor top plate. The holes 1380 also reduce the shunt capacitor value, which may lead to a smaller coil to tune the LC circuit 1300.

Figure 14:
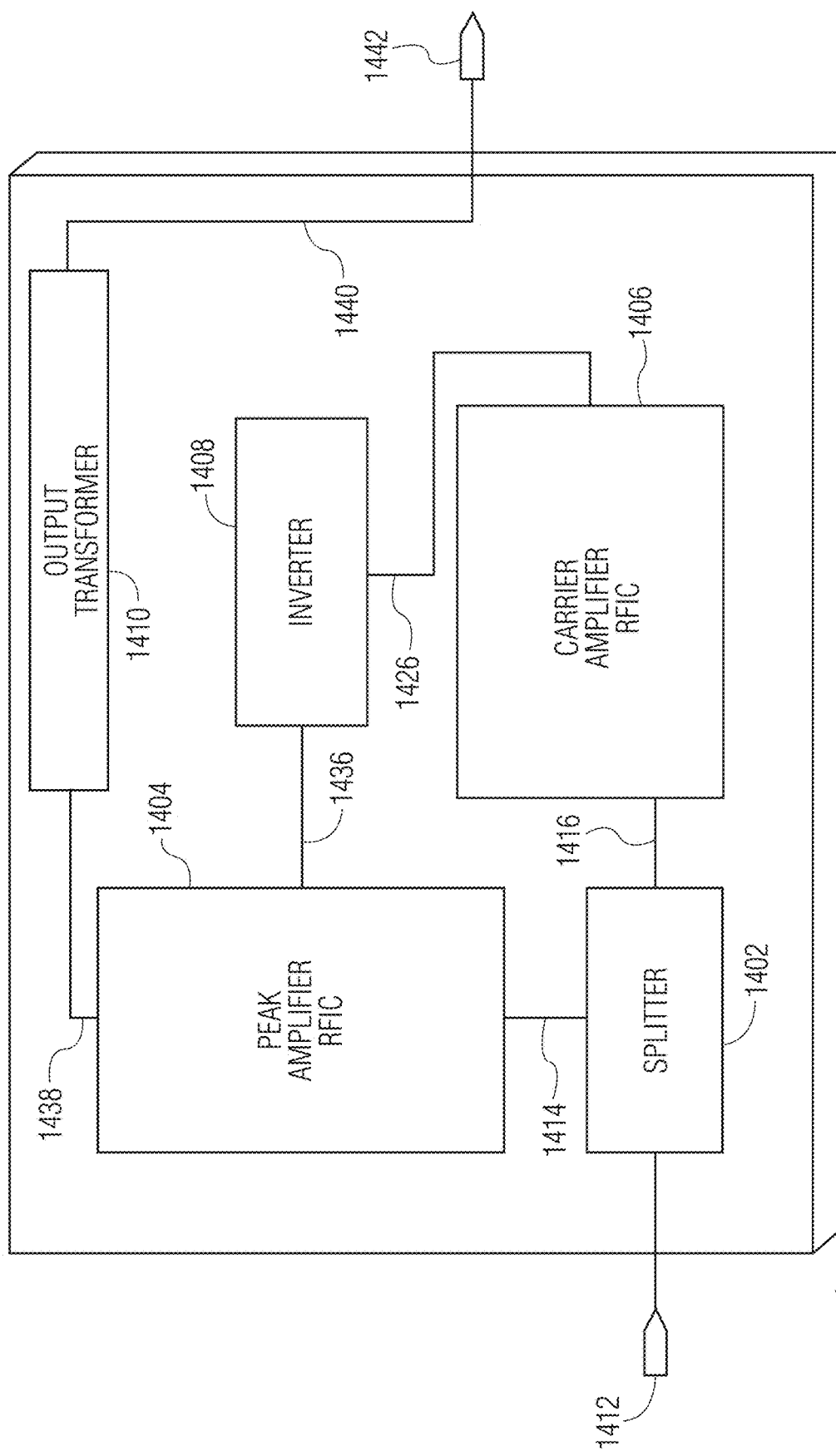
FIG. 14 illustrates one example embodiment of a larger system or module that employs two of the power amplifiers described above, in the form of a Doherty power amplifier module.

Turning to FIG. 14, it should be appreciated that power amplifiers such as the power amplifier 101 that employ one or more improved biasing circuit arrangements can be implemented in any of a variety of other circuits and systems. Indeed, any of a variety of different circuits and systems can employ RFICs with improved stacked LC circuits such as those described above, and the present disclosure should be understood to encompass numerous circuit arrangements including single stage power amplifiers and other types of circuits. FIG. 14 particularly illustrates one example embodiment of a larger system or module that employs two of the power amplifiers 101 described above, in the form of a Doherty power amplifier module 1400. In this example embodiment, the module 1400 particularly includes a splitter 1402, a first peak amplifier RFIC 1404 that can take the form of the power amplifier 101, and a first carrier amplifier RFIC 1406 that can also take the form of the power amplifier 101. Also, the module 1400 further includes a Doherty inverter 1408 coupled between the carrier amplifier RFIC 1406 and the peak amplifier RFIC 1404, and a Doherty output transformer 1410.

Further as shown, the module 1400 includes an RF input terminal 1412 at which an RF signal can be received from another source. The RF input terminal 1412 is coupled to the splitter 1402 such that the power of the RF input signal is divided by the splitter. The splitter in turn is coupled to each of the peak and carrier amplifier RFICs 1404 and 1406, by way of respective conductive links 1414 and 1416, respectively, by which split portions of the RF input signal (or split portions of a modified version of that signal) are provided to each of the RFICs.

The carrier amplifier RFIC 1406 also outputs a first amplified RF output signal to the Doherty inverter 1408 by way of a conductive link 1426, and the Doherty inverter further communicates an RF output signal or a modified version of it via a conductive link 1436 to a combining node (not shown), which in this example is present at the output of the peak amplifier RFIC 1404. The peak amplifier RFIC 1404 outputs a second amplified RF output signal, and the first and second (carrier and peak) amplified signals are combined at the combining node. Finally, as indicated by a conductive link 1438, the combined RF output signal at the combining node is provided via the conductive link 1438 to the Doherty output transformer 1410, which then outputs an RF output signal by way of a conductive link 1440 to a module RF output port 1442.

The capacitors illustrated herein have been shown as rectangular structures, but other shapes are possible. Also, the inductors are shown as rectangular coils, but other shapes may be used as well.

In RFICs, LC circuits may consume about 25% of the total area of the RFIC, and this area grows with increased frequency. By stacking the inductors and capacitors in the LC circuits, this area may be reduced by as much as 50%. The area of the RFIC of FIG. 3 is about 16% less than the area of the RFIC of FIG. 2 due to the stacked LC circuits. In other embodiments, the same RFIC area may be maintained, but utilizing less area for the LC circuits (e.g., using stacked LC circuits) means that more area is available for the power amplifiers and other components, which may leader to a higher power device with the same area.

The embodiments of the stacked LC circuits allow for the centrally-located inductor terminal to be connected directly to the top plate of the capacitor. This has the advantage of fostering more uniform current density in the capacitor, and thus potentially thinner capacitor plates. Also, this enables the removal of an underpass connection between the capacitor and inductor and simplifies the connection between the inductor and capacitor.

The embodiments of the stacked LC circuits also allow for reducing the resistance value of an associated resistor in an RLC circuit, or enabling the resistor to be eliminated altogether. Further, an embodiment of the capacitor may have holes in the capacitor plates that may help to reduce fringe effects with the inductor as well as reducing the capacitance of the capacitor.

The amount of overlap between inductors and capacitors may be chosen to balance the area savings with other circuit parameters. Also, the relative sizes of the inductor and capacitor may affect the amount of overlap.

It should be appreciated that the present disclosure is intended to encompass a variety of additional embodiments in addition to those specifically described above or shown in FIGS. 1 through 14.

Various embodiments relate to an integrated circuit including: a semiconductor die; a transistor device integrally formed in the semiconductor die and having input and output terminals; and an inductor-capacitor (LC) circuit coupled to one of the terminals of the transistor device, the LC circuit comprising: a capacitor integrally formed in the semiconductor die and having a top plate and a bottom plate; an inductor integrally formed in the semiconductor die and having a coil structure and a first terminal; and a connector configured to couple the first terminal of the inductor and an interior portion of the top plate of the first capacitor, wherein the inductor at least partially overlaps the capacitor.

Further various embodiments relate to a power amplifier system in an integrated circuit, the system including: a first transistor device having a first input terminal and a first output terminal; a second transistor device having a second input terminal and a second output terminal; an input matching circuit coupled to the first input terminal of the first transistor, the input matching circuit including a first inductor-capacitor (LC) circuit; an interstage matching circuit coupled between the first output terminal of first transistor and the second input terminal of the second transistor, the interstage matching circuit including a second LC circuit; wherein the first and second LC circuits each include: a capacitor having a top plate and a bottom plate; an inductor having a coil structure; and a connector configured to couple the inductor and an interior portion of the top plate of the capacitor, wherein the inductor at least partially overlaps the capacitor.

Various embodiments relate to a power amplification system including: an RF input terminal; a peak amplifier RF integrated circuit coupled at least indirectly to the RF input terminal; a carrier amplifier RF integrated circuit coupled at least indirectly to the RF input terminal, wherein at least one of the peak amplifier RF integrated circuit and the carrier amplifier RF integrated circuit includes: a transistor device having input and output terminals; and an LC circuit coupled to one of the terminals of the transistor device, the LC circuit including: a capacitor having a top plate and a bottom plate; an inductor having a coil structure; and a connector configured to couple the first inductor and an interior portion of the top plate of the first capacitor, wherein the inductor at least partially overlaps the capacitor.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or

DETAILED DESCRIPTION

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit comprising:
   a semiconductor die;
   a transistor device integrally formed in the semiconductor die and having input and output terminals; and
   an inductor-capacitor (LC) circuit coupled to one of the terminals of the transistor device, the LC circuit comprising:
   a capacitor integrally formed in the semiconductor die and having a top plate and a bottom plate;
   an inductor integrally formed in the semiconductor die and having a coil structure and a first terminal; and
   a connector configured to couple the first terminal of the inductor and an interior portion of the top plate of the first capacitor,
   wherein the inductor at least partially overlaps the capacitor.

2. The integrated circuit of claim 1, wherein capacitor has a hole, wherein the hole is aligned with part of the coil structure.

3. The integrated circuit of claim 1, wherein the coil structure has a corner and wherein the hole is aligned with the corner.

4. The integrated circuit of claim 1, further comprising a resistor coupled in series with the inductor and the capacitor.

5. The integrated circuit of claim 1, wherein the interior portion the top plate of the capacitor includes one of a center 10%, center 20%, and the center 30% of the top plate of the capacitor.

6. The integrated circuit of claim 1, wherein the interior portion the top plate of the capacitor includes one of a center 40%, center 50%, and the center 60% of the top plate of the capacitor.

7. A power amplifier system in an integrated circuit, the system comprising:
   a first transistor device having a first input terminal and a first output terminal;
   a second transistor device having a second input terminal and a second output terminal;
   an input matching circuit coupled to the first input terminal of the first transistor, the input matching circuit including a first inductor-capacitor (LC) circuit;
   an interstage matching circuit coupled between the first output terminal of first transistor and the second input terminal of the second transistor, the interstage matching circuit including a second LC circuit;
   wherein the first and second LC circuits each comprise:
   a capacitor having a top plate and a bottom plate;
   an inductor having a coil structure; and
   a connector configured to couple the inductor and an interior portion of the top plate of the capacitor,
   wherein the inductor at least partially overlaps the capacitor.

8. The power amplifier system of claim 7, wherein capacitor has a hole that is aligned with part of the coil structure.

9. The power amplifier system of claim 7, wherein the coil structure has a corner and wherein the hole is aligned with the corner.

10. The power amplifier system of claim 7, further comprising a resistor coupled in series with the inductor and the capacitor.

11. The power amplifier system of claim 7, wherein the interior portion the top plate of the capacitor includes one of a center 10%, center 20%, and the center 30% of the top plate of the capacitor.

12. The power amplifier system of claim 7, wherein the interior portion the top plate of the capacitor includes one of a center 40%, center 50%, and the center 60% of the top plate of the capacitor.

13. A power amplification system comprising:
   an RF input terminal;
   a peak amplifier RF integrated circuit coupled at least indirectly to the RF input terminal;
   a carrier amplifier RF integrated circuit coupled at least indirectly to the RF input terminal,
   wherein at least one of the peak amplifier RF integrated circuit and the carrier amplifier RF integrated circuit includes:
   a transistor device having input and output terminals; and
   an LC circuit coupled to one of the terminals of the transistor device, the LC circuit comprising:

a capacitor having a top plate and a bottom plate;
an inductor having a coil structure; and
a connector configured to couple the first inductor and an interior portion of the top plate of the first capacitor,
wherein the inductor at least partially overlaps the capacitor.

14. The power amplification system of claim 13, wherein capacitor has a hole that is aligned with part of the coil structure.

15. The power amplification system of claim 13, wherein the coil structure has a corner and wherein the hole is aligned with the corner.

16. The power amplification system of claim 13, further comprising a resistor coupled in series with the inductor and the capacitor.

* * * * *